United States Patent [19]

Hauge et al.

[11] Patent Number: 4,536,717
[45] Date of Patent: Aug. 20, 1985

[54] COMPENSATED INVERTING/NONINVERTING DIFFERENTIAL AMPLIFIER

[75] Inventors: Raymond C. Hauge, Fox River Grove; Victor G. Mycynek, Des Plaines, both of Ill.

[73] Assignee: Zenith Electronics Corporation, Glenview, Ill.

[21] Appl. No.: 538,291

[22] Filed: Oct. 3, 1983

[51] Int. Cl.³ .............................................. H03F 3/45
[52] U.S. Cl. ..................................... 330/254; 330/260
[58] Field of Search ............... 330/252, 254, 260, 261, 330/259

[56] References Cited

U.S. PATENT DOCUMENTS 4,216,435 8/1980 Ahmed ................................ 330/259

OTHER PUBLICATIONS

"201 Analog IC Designs" by the staff of Interdesign, Inc., Sunnyvale, CA, pp. 37-38.

Primary Examiner—James B. Mullins
Assistant Examiner—G. Wan

[57] ABSTRACT

A linear gain differential amplifier having feedback stabilization which is capable of providing inverted and noninverted outputs of equal amplitude is disclosed. A pair of coupled voltage following, feedback stabilized amplifier circuits provide a differential output which is a function of only the respective input signals and the passive component values in the circuit. The present invention is capable of operating at high frequencies over a wide bandwidth and is particularly adapted for video signal processing where linear gain, DC stability, phase compensation and high frequency response are required in order to prevent video luminance and chrominance fluctuations caused by differential gain and phase distortion. More specifically, the present invention is particularly adapted for use as a compensated inverting/noninverting differential amplifier such as employed in a subscription television system encoder, a full wave precision rectifier, or in any application requiring a high performance differential amplifier.

4 Claims, 6 Drawing Figures

COMPENSATED INVERTING/NONINVERTING DIFFERENTIAL AMPLIFIER

BACKGROUND OF THE INVENTION

This invention relates generally to electronic signal processing circuitry and more specifically is directed to an inverting/noninverting differential amplifier circuit in which the differential gain is highly linearized by means of a feedback correction signal arrangement.

In general, a differential amplifier provides two outputs proportional to the difference between the voltages applies to its two inputs. A balanced drive of two inputs may be provided to the differential amplifier or the differential amplifier may be single endedly driven. In the latter case a single input signal is provided to the differential amplifier and compared with a reference signal level in generating the output signals proportional to the difference between the input and reference signal levels.

A differential amplifier generally includes a differentially connected pair of active semiconductor devices, typically transistors which are preferably in integrated form. Since the integrated transistors are highly nonlinear and not well matched in all of their electrical characteristics, common configurations of the differential amplifier still exhibit nonlinearities in gain and matching between their two balanced outputs.

The most common source of nonlinearity is due to transistor emitter resistance dependence upon signal current. Matching between the two outputs is also degraded by output impedance differences relating to circuit gain and $\beta$.

Additional factors that limit amplitude and phase response matching between the inverted and noninverted outputs of the common differential amplifier arise from signal voltage dependent parasitic capacitances and resistances. In the case of a single endedly driven differential amplifier these parasitic effects are not balanced out or compensated for.

The aforementioned nonlinearities and unmatched conditions in the amplifier give rise to signal processing degradation generally termed distortion. Unwanted signal distortion is sometimes further described in terms of nonlinearities in system operating parameters. The goal, of course, is to minimize distortion from the inputs to the outputs of the differential amplifier in linearizing its gain over a large range of signal frequencies and amplitudes. In the case of a single input, it is highly desirable to provide equal phase delays on its respective balanced outputs.

In prior art differential amplifiers the output signals are generally derived from the collectors of the output transistors. Emitter impedance varies with differential amplifier signal level causing nonlinearities in the amplifier output. As signal amplification is increased, amplifier nonlinearities increase and signal distortion becomes greater. While the prior art discloses differential amplifiers with negative feedback in which the output signals are derived from the collectors of output transistors, these amplifiers are generally limited to a single amplifier stage and have limited frequency response. These amplifiers when single endedly driven suffer from unequal amplitude and phase response resulting from parasitic effects on the driven portion of the amplifier. One example of this type of differential amplifier is disclosed in a document entitled "201:Analog IC Designs" published by Interdesign, Inc., of Sunnyvale, Calif. The aforementioned parasitics are signal dependent and therefore nonlinear and unacceptable in precision signal processing applications.

The present invention is intended to overcome the aforementioned limitations of the prior art by providing a feedback gain stabilized differential amplifier possessing highly linear operating characteristics over a large range of signal amplitudes and frequencies. The differential amplifier of the present invention provides compensated inverting/noninverting outputs of equal frequency response and equal phase delay.

OBJECTS OF THE INVENTION

Accordingly, it is an object of the present invention to provide an improved inverting/noninverting differential amplifier having a highly linearized gain characteristic.

Another object of the present invention is to provide a high frequency differential amplifier having a large bandwidth which is particularly adapted for operation with video signals.

Still another object of the present invention is to provide an inverting/noninverting differential amplifier wherein the gain is stabilized over a large range of signal amplitudes and frequencies by means of a correction signal feedback arrangement.

A further object of the present invention is to provide an inverting/noninverting differential amplifier particularly adapted for use in a signal modulator or demodulator, a full wave rectifier, a current steering comparator, or for providing a plurality of precisely controlled inverted and/or noninverted output signals.

A still further object of the present invention is to provide a feedback gain stabilized inverting/noninverting differential amplifier having switched phase delay compensation.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings, in which:

DESCRIPTION OF THE PREFERRED EMBODIMENTS

Figure 1:
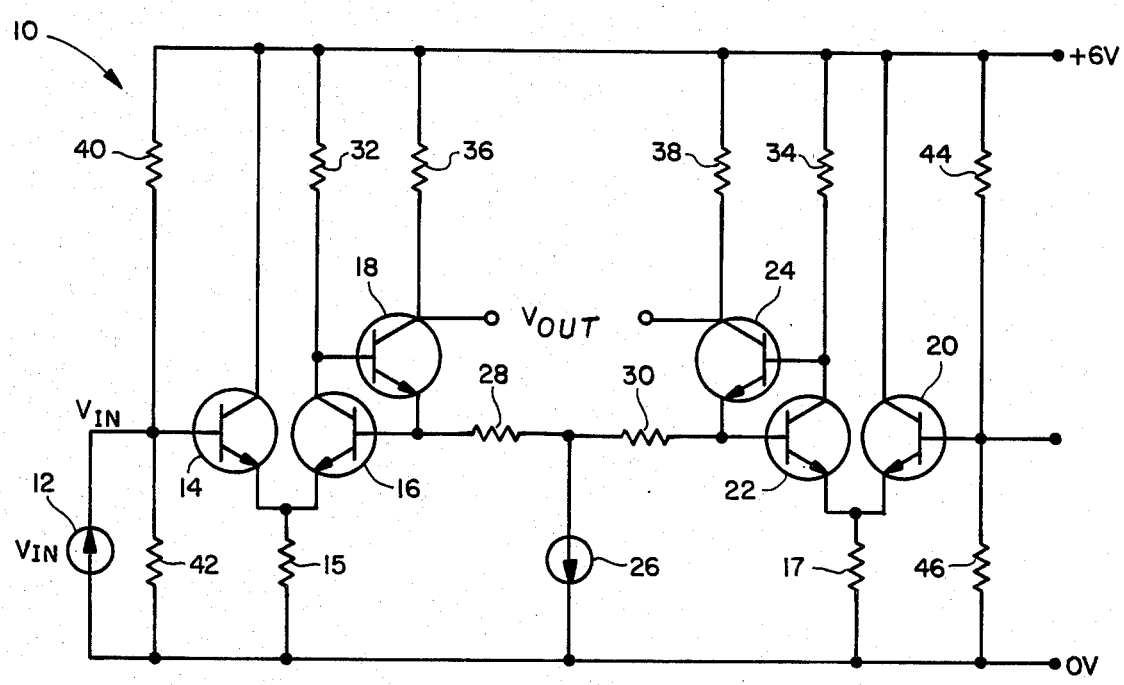
FIG. 1 is a schematic diagram of one embodiment of a differential amplifier in accordance with the present invention.

Referring to FIG. 1, there is shown a feedback gain stabilized differential amplifier 10 in accordance with the present invention.

Differential amplifier 10 generally includes two, parallel voltage following amplification stages comprised of coupled NPN transistors 14, 16 and 18 and transistors 20, 22 and 24. As shown in FIG. 1, a single AC current source $I_{IN}$ 12 provides an AC voltage input to the differential amplifier 10. This input voltage, $V_{IN}$, is provided to the base of transistor 14 while the base of the corresponding transistor 20 in the right hand voltage following amplification stage is maintained at a predetermined reference voltage level. Thus, while the differential amplifier of the present invention as shown in FIG. 1 is used to process a single input signal, it will operate equally well with differential inputs coupled to the two input transistors 14, 20.

Differential amplifier 10 operates in the following manner. The input voltage $V_{IN}$ provided to the base of transistor 14 by signal current source 12 renders transistor 14 conductive. Transistor 14 is coupled to transistor 16 by means of their respective emitters to form a high gain amplifier. With transistor 14 rendered conductive, signal current passes through the emitters and out the collector of transistor 16. Most of the collector signal current of transistor 16 is delivered to the base of transistor 18 which is thereby rendered conductive. The emitter of transistor 18 is coupled in a feedback arrangement to the base of transistor 16 with one output signal, $V_{OUT}$, of the differential amplifier derived from the collector of transistor 18. A similar amplification and feedback arrangement exists with respect to NPN transistors 20, 22 and 24 in the right hand stage with a second output signal derived from the collector of transistor 24.

Transistors 18 and 24 provide a feedback control signal to coupled transistors 14, 16 and 20, 22, respectively. This feedback arrangement is commonly termed a voltage follower wherein the voltage at the emitter of transistor 18 closely follows the corresponding $V_{IN}$ values. In a similar arrangement the emitter of transistor 24 is held at the value of the base voltage of transistor 20. Typically, the emitter impedance of transistors 18, 24 is modulated by and varies as a function of the current through its respective transistor. Without feedback the gain of the differential amplifier comprised of transistors 18, 24, resistors 28, 30, 36, 38 together with the signal modulated emitter impedances of transistors 18, 24 would cause amplifier distortion and result in degraded differential amplifier performance. The high gain signals fed back from the emitters of transistors 18, 24 to the bases of transistors 16, 22, respectively, eliminate the effect of emitter impedances and linearize the differential amplifier output, $V_{OUT}$.

Since the voltage at the emitter of transistor 18 closely follows the base of transistor 14, and the emitter of transistor 24 closely follows the base of transistor 20, the emitter signal currents in transistors 18 and 24 depend for the most part only upon resistors 28 and 30. In addition, for high beta transistors the collector currents of transistors 18 and 20 are essentially equal to their emitter currents. These relationships establish in FIG. 1 a highly linear relationship between the voltage $V_{IN}$ and the collector outputs of transistors 18 and 24. As in the case of an ordinary differential amplifier that is single ended driven, the input will form an inverted output at the collector of transistor 18 and a noninverted output at the collector of transistor 24.

In a preferred embodiment, a +6 VDC is applied across differential amplifier 10. Resistors 40, 42 and 44, 46 provide proper biasing for transistors 14, 20, respectively. In addition, since the current source 12 is coupled to the base of transistor 14, resistors 40, 42 serve as a load for the current source in providing an input voltage, $V_{IN}$, to the base of transistor 14. Resistors 32, 34 form a load on the collectors of transistors 16, 22 respectively. In addition, resistors 32, 34 together with resistors 15, 17 provide proper biasing for the amplification stages comprised of transistors 14, 16 and 20, 22, respectively.

Proper biasing of output transistors 18, 24 is provided by DC current source 26. Resistors 28, 36 and 30, 38 respectively coupled across transistors 18, 24 define the gain of the output voltage derived from the collector of a respective output transistor. With each transistor amplifier stage possessing high gain, essentially all signal current circulating between the emitters of transistors 18, 24 will be transferred to the collector circuits of a respective output transistor, insuring high linearity from input to output of each branch of the feedback gain stabilized differential amplifier 10. The voltage following characteristics of the transistor arrangement in each branch of the differential amplifier 10 insures that the emitter voltages of transistors 18 and 24 precisely track the input voltages provided to the bases of transistors 14, 20, respectively. The coupled emitter arrangement of transistors 18 and 24 results in the current circulating through resistances 28, 30 being a function not of individual transistor operating characteristics but only of the value of $V_{IN}$ and the values of resistors 28, 30. Because of the high gain in each branch of the differential amplifier, the signal current required by the bases of transistors 16, 22 is very small permitting virtually all of the current to be transmitted through the emitters to the collectors of output transistors 18, 24.

Figure 2:
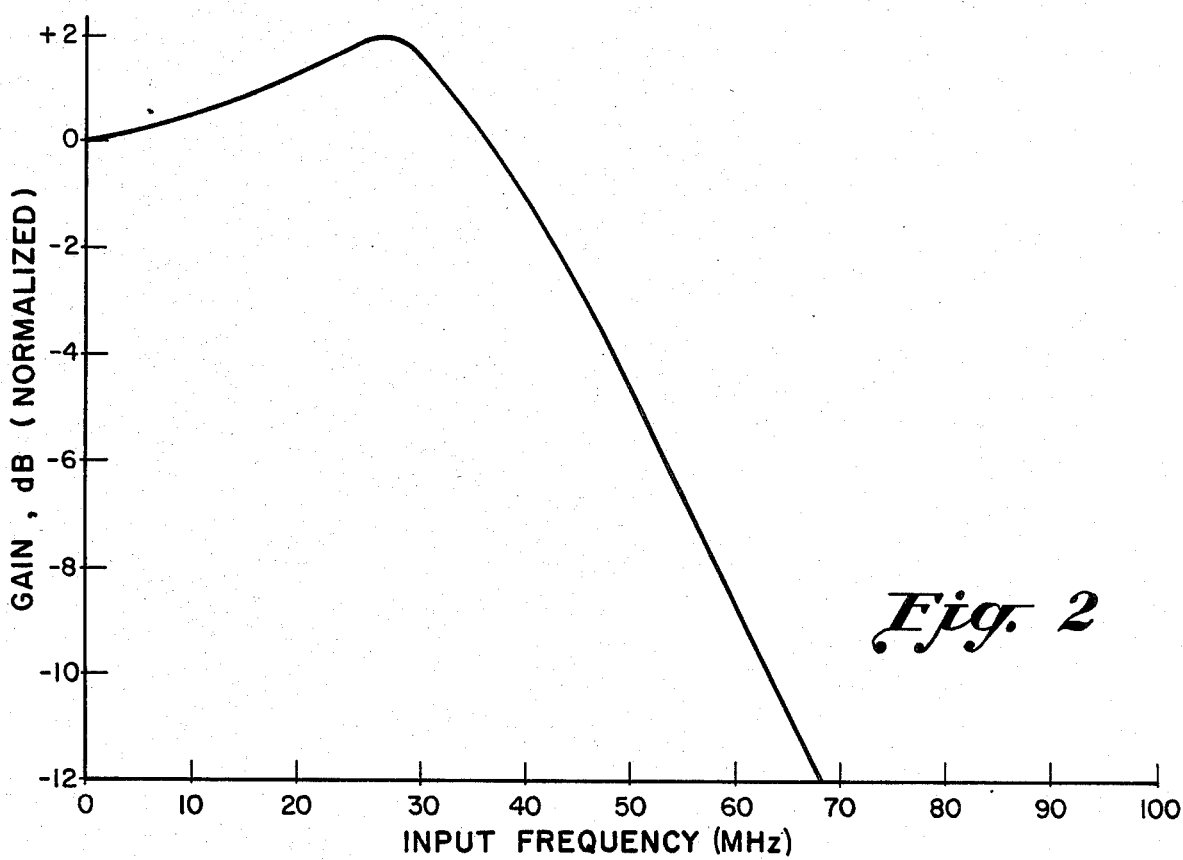
FIG. 2 shows the frequency response characteristic of the differential amplifier of FIG. 1.

Referring to FIG. 2, there is shown the calculated frequency response of the feedback gain stabilized differential amplifier of FIG. 1. The frequency response curve takes into consideration typical transistor operating parameters, which are generally taken into consideration by a circuit designer in determining circuit operation by means of a simulated computer program. From FIG. 2, it can be seen that the differential amplifier shown in FIG. 1 is capable of operating over a bandwidth of approximately 45 MHz, and is particularly adapted for high frequency operation such as utilized in the processing of video signals, i.e., up to approximately 30 MHz.

Figure 3:
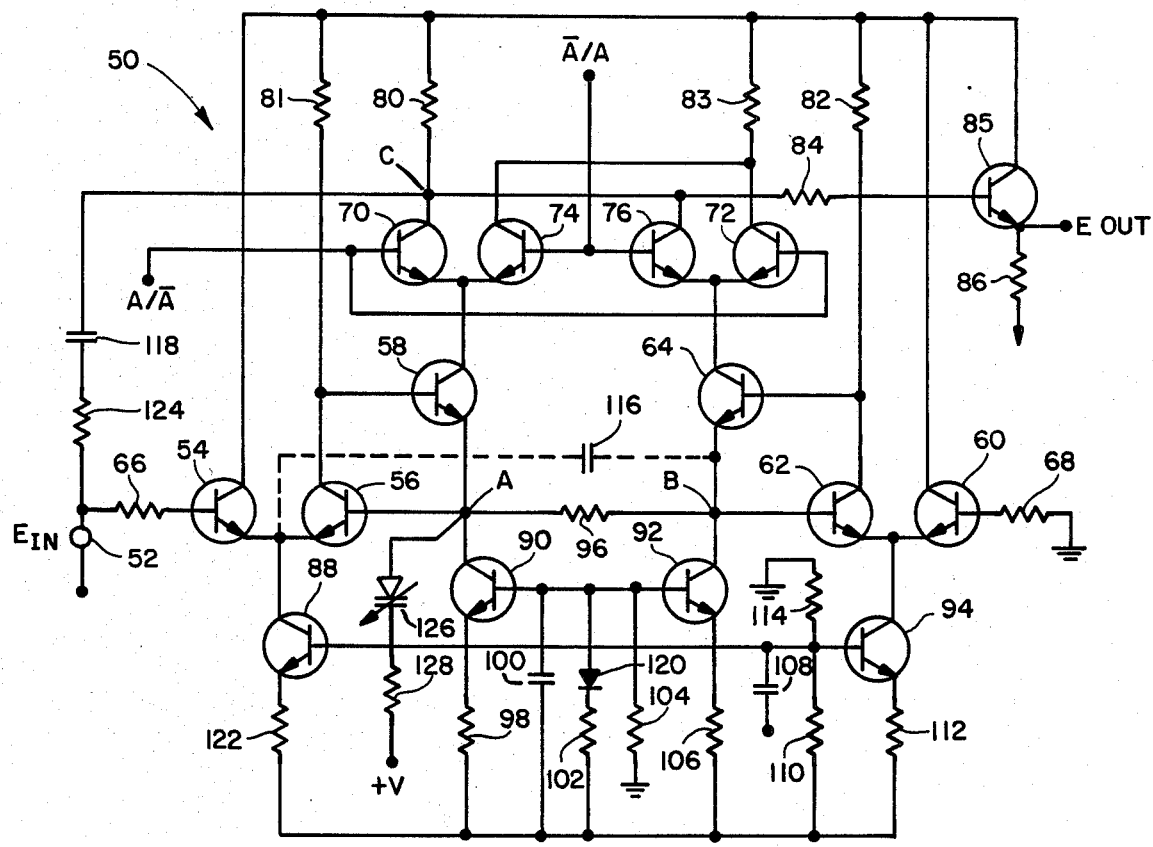
FIG. 3 is a schematic diagram showing a compensated inverting/noninverting differential amplifier in accordance with a preferred embodiment of the present invention.

Referring to FIG. 3, there is shown a compensated inverting/noninverting differential amplifier 50 utilizing the differential amplifier of FIG. 1. The inverting/noninverting differential amplifier 50 of FIG. 3 is driven by a single voltage source 52 which provides an input voltage $E_{IN}$ to the base of transistor 54. NPN transistor 54 together with NPN transistor 56 form an emitter coupled pair with transistor 58 in a feedback arrangement with transistors 54 and 56. Thus, transistors 54, 56 form a high gain amplifier, and together with transistor 58 form a voltage following feedback amplifier. A similar arrangement exists between transistors 60, 62 and 64 in the right hand branch of the inverting/noninverting differential amplifier 50, although the base of transistor 60, as shown in FIG. 3, is maintained at neutral ground potential. Resistors 66, 68 are for standard oscillation suppression of transistors 54 and 60, respectively.

Transistors 90, 92 act as current sources to provide bias current for transistors 58 and 64. Transistors 88, 94 provide biasing current for emitter-coupled transistors 54, 56 and 60, 62, respectively. Resistors 122, 98, 106 and 112 provide proper biasing through transistors 88, 90, 92 and 94, respectively. Capacitors 100, 108 keep noise and signals out of transistors 90 and 92 while diode 120 and resistors 102, 104 provide a temperature compensated DC bias voltage to the bases of transistors 90, 92. Resistors 110, 114 along with capacitor 108 perform a similar function in the DC biasing of transistors 88 and 94.

An inverting switching input $A/\overline{A}$ is provided to the bases of transistors 70, 72. A noninverting switching input $\overline{A}A$ is provided to the bases of transistors 74, 76. The relationship of $A/\overline{A}$ to $\overline{A}A$ is as follows: $A/\overline{A}$ is high when $\overline{A}A$ is low. Conversely, $\overline{A}A$ is high when $A\overline{A}$ is low. If the $\overline{A}A$ input goes high, transistors 74, 76 are turned on while transistors 70, 72 are turned off. If the $A\overline{A}$ input goes high, transistors 70, 72 are turned on while transistors 74, 76 are turned off. Resistors 80, 81, 82 and 83 form a load on the collectors of the respective transistors to which they are coupled. $E_{IN}$ provided to the base of transistor 54 is compared with the reference voltage level at which the base of transistor 60 is maintained, and precise output signal currents are provided by the collectors of transistors 58 and 64 representing the inverting and noninverting version of $E_{IN}$. The collector output currents of transistors 58, 64 are provided respectively to coupled transistors 70, 74 and 72, 76 which perform a current steering function. Thus, $E_{IN}$ is compared with the reference level at which transistor 60 is maintained and an output current signal is provided to load resistor 80 via transistor 70 or 76. These latter, current steering transistors are, in turn, controlled by the inverting $A/\overline{A}$ and noninverting $\overline{A}/A$ switching inputs provided to the respective bases thereof. Thus, if an inverting switching input is provided ($A/\overline{A}$ high and $\overline{A}/A$ low), transistors 70, 72 are rendered conducting with an inverted output voltage provided across load resistor 80 and an output signal $E_{OUT}$ provided on the base of output transistor 85 via resistor 84. With a noninverting switching signal provided ($A/\overline{A}$ low and $\overline{A}/A$ high), a noninverted output voltage is provided across the same load resistor 80. Thus, the load resistor is precluded from causing any error in the magnitude of the output voltage. Resistor 86 provides for the proper biasing of the output transistor 85. An alternative signal output could be derived from load resistor 83 by simply connecting the collectors of transistors 74, 72 to the base of transistor 85 via resistor 84, although this is not shown in the figure.

FIG. 3 includes two arrangements for phase compensation in the inverting/noninverting amplifier 50. One approach involves coupling a capacitor 116 from the emitter of transistor 64 to the coupled emitters of transistors 54, 56. Capacitor 116 operates in the following manner in compensating for a phase difference that deviates from 180° between the inverted and noninverted output currents provided by the collectors of transistors 58 and 64. Transistor 58 is subjected to a signal dependent capacitance along with other parasitic capacitances to ground via its own emitter, the collector of transistor 90 and the base of transistor 56. Due to the parasitic capacitance associated with the emitter of transistor 58, the current in the collector of transistor 58 (the inverted output) will depend not only upon the signal voltages at points A and B along with the resistance 96, but also upon the signal current relating to the capacitive current through these parasitics. In the case of transistor 64 whose collector provides the noninverted output, its emitter does not move with signal voltages and therefore does not see the parasitic effect. The emitter current of transistor 64 is nearly ideally proportioned to the signal voltage at point A and the resistance 96 between points A and B. Therefore, the inverted output will have additional signal-related effects due to the parasitics on the emitter of transistor 58 while the noninverted output will not be affected by these parasitics. Capacitor 116 can compensate for the average effect of the capacitances associated with the emitter of transistor 58. This can be accomplished by also introducing signal currents into the emitter of transistor 64 via capacitor 116. The valve of capacitance chosen for capacitor 116 should be equal to the average parasitic capacitance seen by the emitter of transistor 58. In this application, the output $E_{OUT}$ is switched electronically between the inverted and noninverted outputs of transistors 58 and 64 via transistors 70, 74 and 76 and 72, respectively.

A more complete method of compensation for these parasitics is accomplished in the preferred design. This may be referred to as switched capacitive compensation. In this case capacitor 116 is not used. A varactor diode 126 is used to compensate for the nonlinear portion of the parasitic capacitance seen by the circuit at point A. Resistor 124 compensates for the fact that varactor diode 126 requires series resistor 128 for stable operation. In this type of compensation, the reactance of varactor diode 126 adds to the parasitic capacitance at point A in such a way as to cancel the nonlinear signal-related effect. The added varactor diode 126 also adds to the total capacitance at point A. Therefore, capacitor 118 must be made larger in this total compensation case to make up for the larger capacitance at point A.

In the switched inverted/noninverted feedback gain stabilized differential amplifier 50 the compensation acts as follows, for the case of a unity gain amplifier with resistors 96 and 80 equal, with capacitor 118 and series resistor 124 connected between $E_{IN}$ and the collectors of transistors 70 and 76. For the noninverting case ($\overline{A}/A$ high and $A/\overline{A}$ low), $E_{OUT}$ is equal to $E_{IN}$ and no effects are felt. For the inverting case, $E_{OUT}$ is equal to $-E_{IN}$ and the full effects of resistor 128 and varactor 126 along with the parasitics associated with point A are felt. Capacitors and resistors associated with point A and the feed forward connection made up of resistor 124 and capacitor 118 form a phase and amplitude equalizer that exactly compensates the inverting output so as to match the noninverting output.

The following comments relating to the amplitude and phase response desired at the output $E_{OUT}$ for the inverted and noninverted cases are now provided to further explain the operating characteristics of the circuit shown in FIG. 3:

(1) Amplitude and phase response are related to each other and the compensation of one will have an effect on the other;

(2) It is desired to precisely match the inverted and noninverted outputs forming $E_{OUT}$ in terms of both amplitude and phase response;

(3) The amplitude and phase response associated with the collector of transistor 58 suffers from the effects of nonlinear parasitic capacitance; and (4) Techniques to be further explained compensate for all parasitics that are measurable and troublesome in the present application. In the switched capacitor technique a capacitor 118 in series with resistor 124 is connected between the input voltage source 52 and point C. In the case where a noninverting output is desired, unity gain is established by resistors 80 and 96 and the input and output move together.

Figure 4:
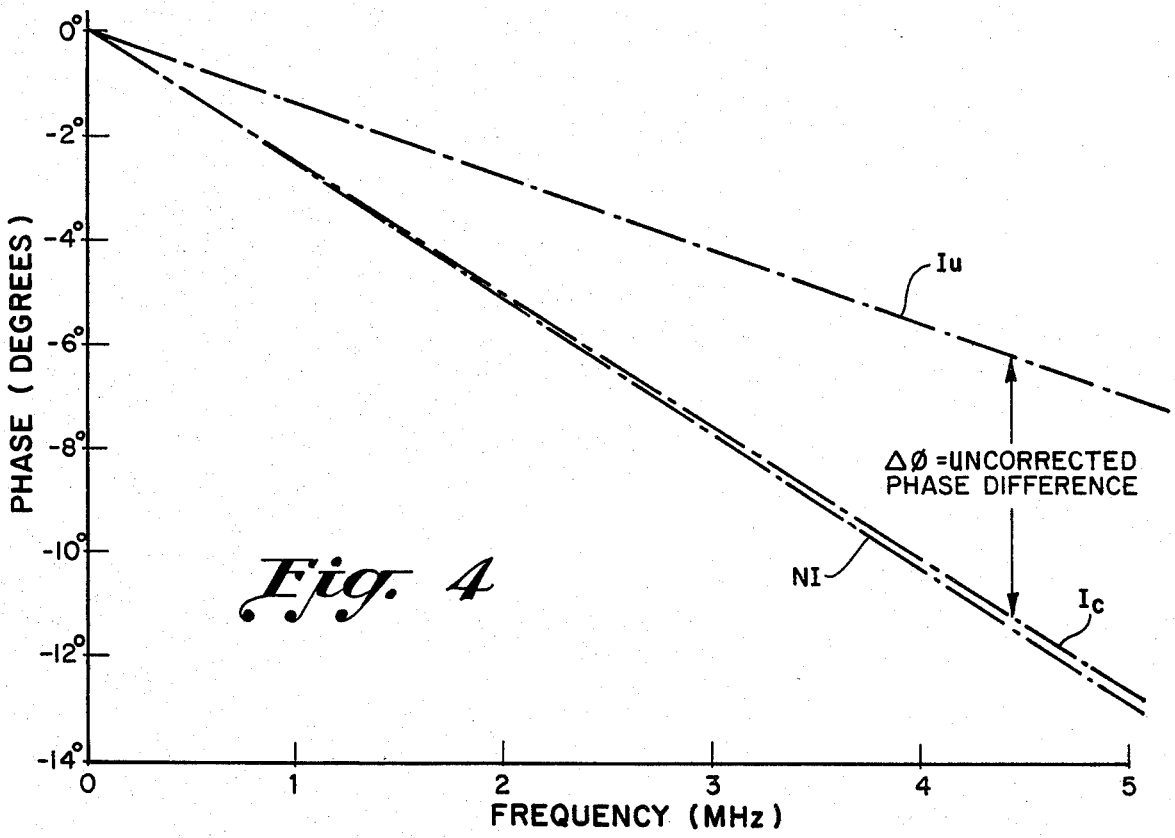
FIG. 4 shows the phase and frequency response of the high frequency linear compensated inverting/noninverting differential amplifier of FIG. 3 with and without phase compensation.

Referring to FIG. 4, there is shown the calculated phase and frequency response of the inverting/noninverting differential amplifier of FIG. 3. $I_u$ represents the calculated phase response for the inverted output at $E_{OUT}$. NI represents the output phase response signal for a noninverted output at $E_{OUT}$. $E_{OUT}$ changes state from inverted to noninverted in response to the changing states of the input signals $A/\overline{A}$ and $\overline{A}/A$. From FIG. 4 it can be seen that a phase difference exists between the inverted and noninverted outputs from the inverting/noninverting amplifier 50. Although not shown in FIG. 4, $I_u$ and $I_c$ also have 180° of phase shift added to them due to the fact that they are associated with the inverted output.

Also shown in FIG. 4 as curve $I_c$ is the calculated phase response of the inverting/noninverting amplifier 50 with capacitor 118 and resistor 124 incorporated therein. A comparison of curves NI and $I_c$ shows that the phase difference between the inverted and noninverted output voltage $E_{OUT}$ has been reduced to essentially zero. In addition, the use of varactor diode 126 and its associated resistor 128 compensates for an amplitude dependent differential phase distortion resulting from nonlinear capacitive parasitics. Adjustment of the value of resistor 124 and capacitor 118 allows for precise amplitude and phase matching between the inverting and noninverting outputs.

Figure 5:
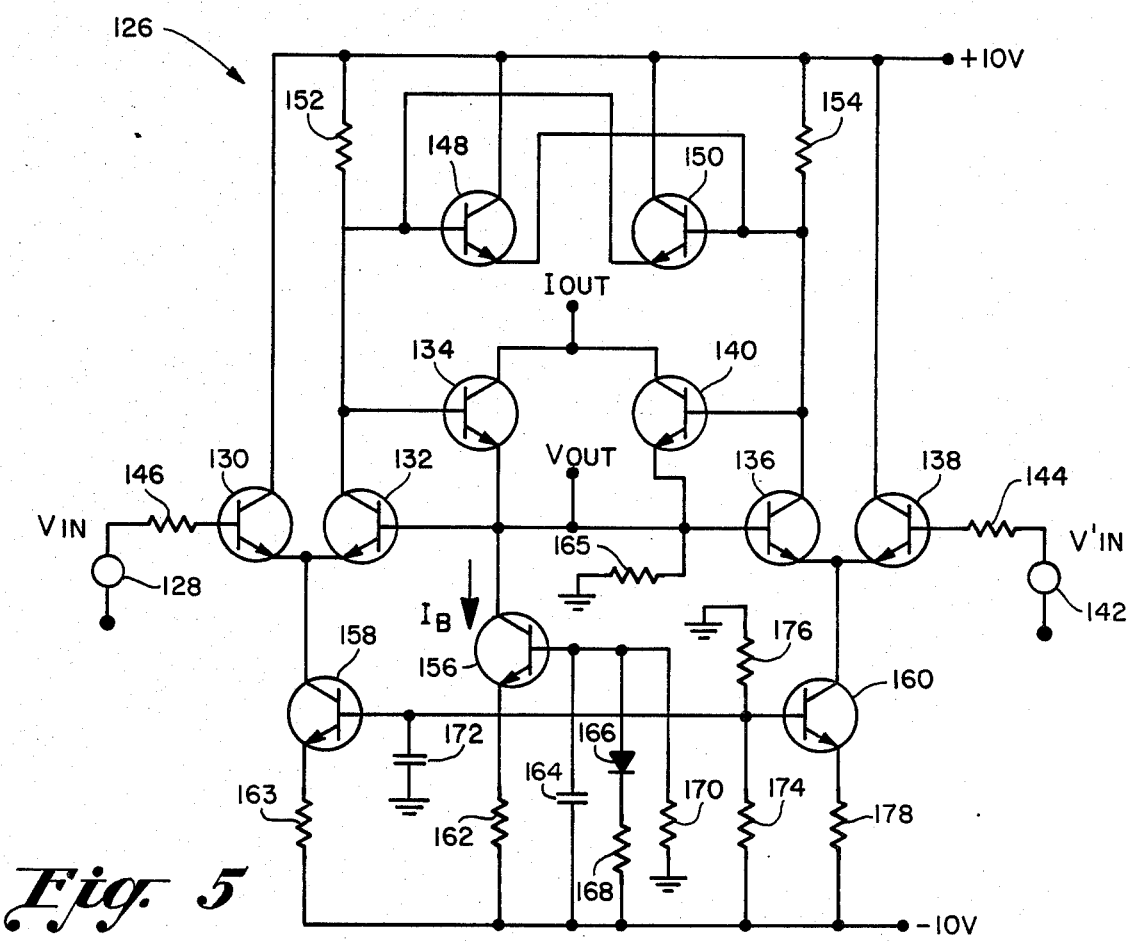
FIG. 5 is a schematic diagram showing a full wave rectifier circuit incorporating the differential amplifier of the present invention as shown in FIG. 1.

Referring to FIG. 5, there is shown a precision full wave rectifier 126 including a differential amplifier as shown in FIG. 1 in accordance with the present invention. The full wave rectifier 126 is driven by inputs $V_{IN}$ and V'HD IN from signal sources 128 and 142. The outputs of the left and right voltage followers comprised respectively of transistors 130, 132 and 134 and transistors 136, 138 and 140 follow precisely the positive going corresponding input signals provided thereto. The emitter of transistor 134 as well as the emitter of transistor 140 and the base of transistor 136 will follow $V_{IN}$ when $V_{IN}$ is more positive than $V'_{IN}$. Under these conditions the full gain of the differential pair made up of transistors 138 and 136 will rapidly pull the base of transistor 140 low. This will cut off transistor 140 and thus block the influence of $V'_{IN}$ from either $V_{OUT}$ or $I_{OUT}$. Thus, $V_{OUT}$ is determined entirely by $V_{IN}$ since transistor 140 is nonconducting. With transistor 140 nonconducting, the output signal may be taken from either the emitters of transistors 134, 140 as $V_{OUT}$ or from the collectors of these transistors as $I_{OUT}$ which is the sum of the collector currents thereof. The full wave rectifier operates in a similar manner when $V_{IN}$ goes low and $V'_{IN}$ goes high with the voltage follower comprised of transistors 136, 138 and 140 providing $V_{OUT}$. In either case, $I_{OUT}$ is dependent only upon $V_{OUT}$, resistor 165 and $I_B$.

In the full wave rectifier of FIG. 5, transistors 148 and 150 keep the respective voltage followers comprised of transistors 130, 132 and 134 and transistors 136, 138 and 140 from saturating. When the collector of one of the emitter coupled transistors 132 or 136 goes low so as to turn off its corresponding output transistor 134 or 140, the collector of transistor 132 or 136 is prevented by transistor 148 or 150 from going so low as to reverse bias the collector to base junction of transistors 132 or 136. This keeps the voltage following differential amplifier from saturating and permits it to quickly recover for stable operation when there is a change from $V_{IN}$ more positive than $V'_{IN}$ to $V'_{IN}$ more positive than $V_{IN}$. Transistors 148, 150 in combination with bias resistors 152, 154 thus perform an anti-saturation function with respect to the differential amplifier in the full wave rectifier 126.

Transistors 158, 160 are respective current sources for the left voltage follower comprised of transistors 130, 132 and 134 and the right voltage follower comprised of transistors 136, 138 and 140. Resistors 163 and 178 provide proper biasing for transistors 158 and 160, respectively. Diode 166 and resistor 168 provide for temperature compensation in the full wave rectifier circuit 126, while resistors 162 and 170 and capacitor 164 perform transistor biasing and filtering functions. Resistors 174 and 176 form a voltage divider on the base of transistor 160, with grounded capacitor 172 filtering the base of transistor 160.

Figure 6:
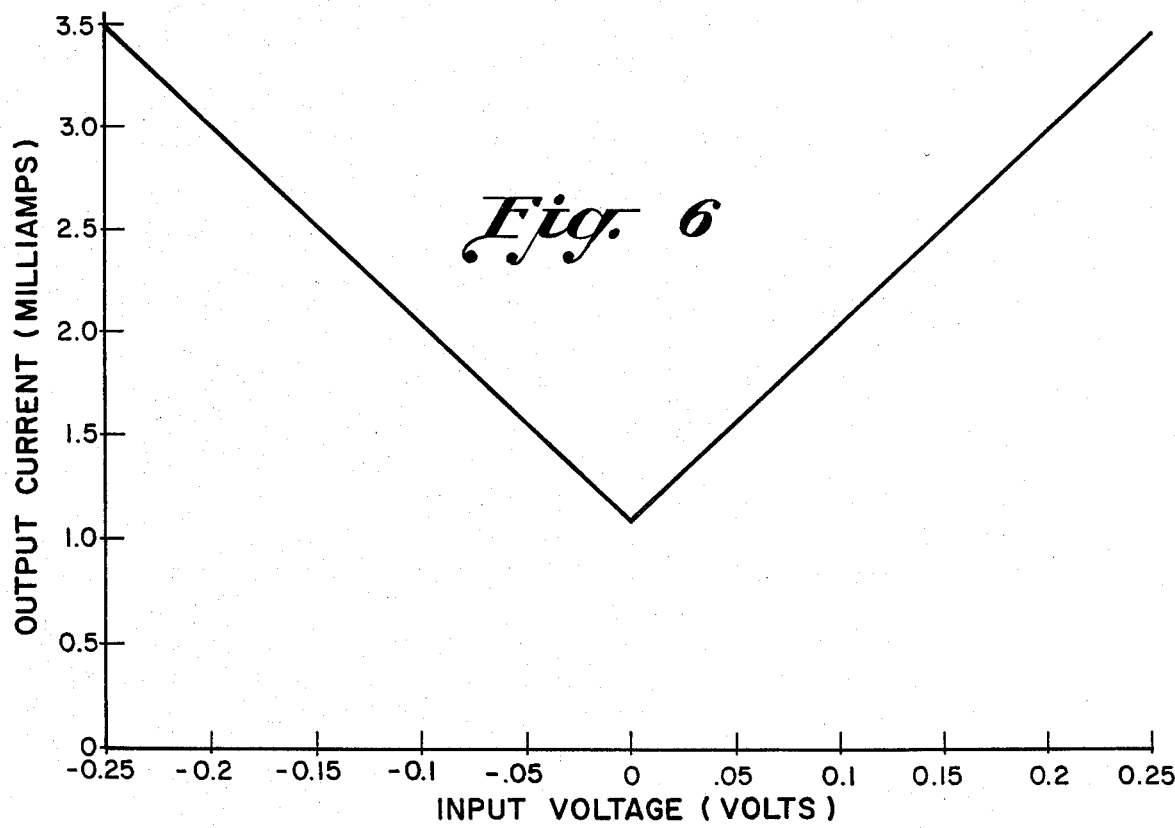
FIG. 6 shows the DC transfer function of the full wave rectifier circuit of FIG. 5.

Referring to FIG. 6, there is shown the calculated DC transfer function for the full wave rectifier of FIG. 5, with $V_{IN} = -V'_{IN}$. As can be seen from FIG. 6, a bottom, center cusp, determined by the current $I_B$ through transistor 156 is well defined in terms of the input voltage and output current.

There has thus been shown a linear gain differential amplifier comprised of coupled voltage following stages with feedback stabilization for providing a differential output which is a function only of the respective input signals and passive component values in the circuit and not of individual transistor operating characteristics which are cancelled out. Phase compensation is provided for the inverted and noninverted modes of operation with the basic differential amplifier configuration easily adapted for use in an inverting/noninverting or a full wave rectifier circuit. The present invention is particularly adapted for use in a subscription television system encoder where high frequency, wide bandwidth and large signal levels are typically encountered.

While particular embodiments of the present invention have been shown and described, it will be apparent to those skilled in the art that changes and modifications may be made therein without departing from the invention in its broader aspects. The aim of the appended claims, therefore, is to cover all such changes and modifications as fall within the true spirit and scope of the invention.

We claim:

1. An inverting/noninverting differential amplifier comprising:

first and second matched transistor pairs each including an interconnected common terminal, an output terminal, and an input terminal to which are provided respective input signals with the input signal provided to the second matched transistor pair being maintained at a constant reference voltage, and wherein said input signals are amplified and provided to respective output terminals;

third and fourth transistors respectively coupled to said first and second matched transistor pairs and responsive to the amplified input signals produced therein for respectively generating inverted and non-inverted output signals proportional to the difference between said respective input signals, said third and fourth transistors each including a base element coupled to a respective output terminal of said first and second matched transistor pairs, a collector element from which said inverted and non-inverted output signals are derived, and an emitter element coupled in a feedback arrangement to the common terminal of a respective first and second matched transistor pair;

a resistive network coupling the common terminals of said first and second matched transistor pairs;

a common output load;

first and second switch means coupled respectively to said third and fourth transistors and responsive to a switching signal for coupling either the inverted or non-inverted output signal to said common load; and a coupling capacitor connecting said first matched transistor pair and said fourth transistor for phase compensating said inverted and non-inverted output signals coupled to said common load by varying the phase of said non-inverted output signal to match that of said inverted output signal.

2. A inverting/noninverting differential amplifier comprising:

first and second matched transistor pairs each including an interconnected common terminal, an output terminal, and an input terminal to which are provided respective input signals with the input signal provided to the second matched transistor pair being maintained at a constant reference voltage and wherein said input signals are amplified and provided to respective output terminals;

third and fourth transistors respectively coupled to said first and second matched transistor pairs and responsive to the amplified input signals produced therein for respectively generating inverted and non-inverted output signals proportional to the difference between said respective input signals, said third and fourth transistors each including a base element coupled to a respective output terminal of said first and second matched transistor pairs, a collector element from which said inverted and non-inverted output signals are derived, and an emitter element coupled in a feedback arrangement to the common terminal of a respective first and second matched transistor pair;

a resistive network coupling the common terminals of said first and second matched transistor pairs;

a common output load;

first and second switch means coupled respectively to said third and fourth transistors and responsive to a switching signal for coupling either the inverted or non-inverted output signal to said common load; and a coupling capacitor coupling the input terminal of said first matched transistor pair and said common output load for phase compensation of said inverted output signal relative to said non-inverted output signal.

3. An inverting/noninverting differential amplifier as in claim 2 further including a resistor connected in series with said coupling capacitor for matching the amplitude response of said inverted output signal relative to that of said noninverted output signal.

4. An inverting/noninverting differential amplifier as in claim 3 further including a voltage variable capacitance and a fixed resistance coupled in series between a potential source and the emitter element of said third transistor for biasing the voltage variable capacitance so as to produce a constant capacitance at the emitter element of said third transistor thereby compensating for nonlinear parasitic capacitance in said differential amplifier.

* * * * *